United States Patent
Lym (10) Patent No.: US 9,396,766 B2
(45) Date of Patent: Jul. 19, 2016

(54) SEMICONDUCTOR DEVICE HAVING MEMORY CHIP STACKS WITH TSV

(71) Applicant: SK hynix Inc., Icheon-si Gyeonggi-do (KR)

(72) Inventor: Sang Kug Lym, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 14/608,705

(22) Filed: Jan. 29, 2015

(65) Prior Publication Data

US 2016/0093378 A1 Mar. 31, 2016

(30) Foreign Application Priority Data

Sep. 30, 2014 (KR) .................. 10-2014-0130658

(51) Int. Cl.
| | |
|---|---|
| *G11C 5/06* | (2006.01) |
| *G06F 12/02* | (2006.01) |
| *G11C 5/02* | (2006.01) |
| *G11C 8/12* | (2006.01) |
| *G11C 14/00* | (2006.01) |
| *G11C 7/10* | (2006.01) |
| *G11C 7/22* | (2006.01) |
| *G11C 17/16* | (2006.01) |
| *G11C 29/44* | (2006.01) |

(52) U.S. Cl.
CPC .............. *G11C 5/06* (2013.01); *G06F 12/0207* (2013.01); *G11C 5/025* (2013.01); *G11C 8/12* (2013.01); *G11C 7/1084* (2013.01); *G11C 7/22* (2013.01); *G11C 14/0018* (2013.01); *G11C 17/16* (2013.01); *G11C 2029/4402* (2013.01)

(58) Field of Classification Search
CPC .............................. G11C 5/06; G06F 12/0207
See application file for complete search history.

(56) References Cited

U.S. PATENT DOCUMENTS

| | | | |
|---|---|---|---|
| 7,532,537 B2 * | 5/2009 | Solomon | G06F 12/0207 365/51 |
| 8,787,060 B2 * | 7/2014 | Lee | G11C 5/06 365/51 |
| 2011/0148469 A1 * | 6/2011 | Ito | G11C 5/04 327/77 |
| 2012/0059984 A1 * | 3/2012 | Kang | H01L 25/18 711/106 |

FOREIGN PATENT DOCUMENTS

KR 1020060065793 A 6/2006

* cited by examiner

*Primary Examiner* — Vanthu Nguyen
(74) *Attorney, Agent, or Firm* — William Park & Associates Ltd.

(57) ABSTRACT

A semiconductor memory device may include a plurality of memory chips stacked upon one another, and electrically coupled to one another through a plurality of first TSVs. The semiconductor memory device may include a plurality of second memory chips stacked separately from the first memory chips, and the plurality of second memory chips electrically coupled to one another through a plurality of second TSVs. The semiconductor memory device may include a plurality of external connection electrodes coupled to both to the first memory chips and the second memory chips. Wherein one of the first and second memory chips may be accessed in response to chip select signals inputted through the external connection electrodes.

20 Claims, 10 Drawing Sheets

SEMICONDUCTOR DEVICE HAVING MEMORY CHIP STACKS WITH TSV

CROSS-REFERENCE TO RELATED APPLICATION

The present application claims priority under 35 U.S.C. §119(a) to Korean Patent Application No. 10-2014-130658 filed in the Korean Intellectual Property Office on Sep. 30, 2014, which is incorporated herein by reference in its entirety.

BACKGROUND

1. Technical Field

Various embodiments generally relate to a semiconductor technology, and more particularly, to a semiconductor chip and a semiconductor package including the same.

2. Related Art

A semiconductor memory device is a memory device which is realized using a semiconductor such as silicon (Si), germanium (Ge), gallium arsenide (GaAs) and indium phosphide (InP). The semiconductor memory device may be classified generally as a volatile memory device or a nonvolatile memory device.

SUMMARY

In an embodiment, a semiconductor memory device may include a plurality of memory chips stacked upon one another, and electrically coupled to one another through a plurality of first TSVs. The semiconductor memory device may include a plurality of second memory chips stacked separately from the first memory chips, and the plurality of second memory chips electrically coupled to one another through a plurality of second TSVs. The semiconductor memory device may include a plurality of external connection electrodes coupled to both the first memory chips and the second memory chips. Wherein one of the first and second memory chips may be accessed in response to chip select signals inputted through the external connection electrodes.

DETAILED DESCRIPTION

Hereinafter, a semiconductor memory devices will be described below with reference to the accompanying drawings through various examples of embodiments.

Figure 1:
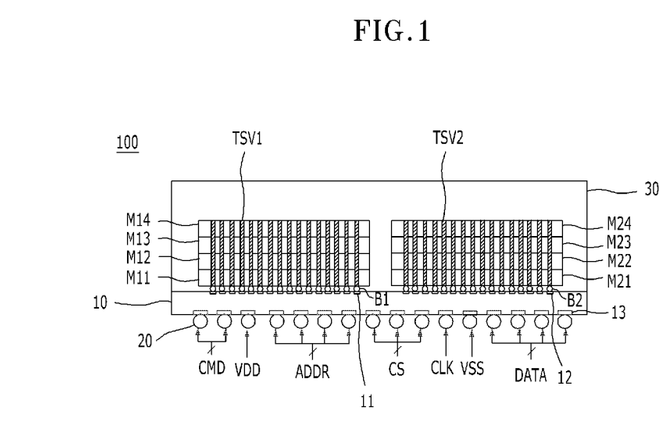
FIG. 1 is a view illustrating an example of a representation of a semiconductor memory device in accordance with an embodiment.

FIG. 1 is a view schematically illustrating an example of a representation of a semiconductor memory device in accordance with to an embodiment.

Referring to FIG. 1, a semiconductor memory device 100 may include a plurality of first memory chips M11 to M14 stacked upon one another. The semiconductor memory device 100 may include a plurality of second memory chips M21 to M24 stacked upon one another separately from the first memory chips M11 to M14.

The first memory chips M11 to M14 may all have substantially the same configurations, and may all be DRAM (dynamic random access memory) chips capable of performing a read operation and a write operation independently of one another. The second memory chips M21 to M24 may all have substantially the same configurations, and may all be flash memory chips capable of performing a read operation, a write operation and an erase operation independently of one another.

While not illustrated, each of the first and second memory chips M11 to M14 and M21 to M24 may include a core circuit region where memory cells are formed and a peripheral circuit region where peripheral circuits for the memory cells are formed.

The first memory chips M11 to M14 may be DRAMs and the second memory chips M21 to M24 may be flash memories, however, the embodiments are not limited to such. For example, each of the first memory chips M11 to M14 may be any one of volatile memories such as a DRAM, an SRAM (static RAM) and an SDRAM (synchronous DRAM. For example, each of the second memory chips M21 to M24 may be any one of nonvolatile memories such as a flash memory, a ROM (read only memory), a PROM (programmable ROM), an EPROM (electrically programmable ROM), an EEPROM (electrically erasable and programmable ROM), a PRAM (phase-change RAM), an MRAM (magnetic RAM), an RRAM (resistive RAM) and an FRAM (ferroelectric RAM).

Also, while it is illustrated that 4 first memory chips and 4 second memory chips are stacked, the embodiments are not limited to such. It is to be noted that all examples where each of the number of first memory chips to be stacked and the number of second memory chips to be stacked is 2 or over fall within the scope of the embodiments.

The first memory chips M11 to M14 may be electrically coupled through a plurality of first TSVs (through-silicon vias) TSV1. The second memory chips M21 to M24 may be electrically coupled through a plurality of second TSVs TSV2. The first TSVs TSV1, as transfer paths of signals or power necessary for the operations of the first memory chips M11 to M14, pass through the first memory chips M11 to M14 and may be electrically coupled with the first memory chips M11 to M14. The second TSVs TSV2, as transfer paths of signals or power necessary for the operations of the second memory chips M21 to M24, pass through the second memory chips M21 to M24 and may be electrically coupled with the second memory chips M21 to M24. The signals may include data signals and control signals, to and the power may include a power supply voltage VDD and a ground voltage VSS.

The first memory chips M11 to M14 and the second memory chips M21 to M24 may be horizontally mounted on a substrate 10 and may be assembled as one package.

The substrate 10 may include an upper surface on which the first memory chips M11 to M14 and the second memory chips M21 to M24 may be mounted. The substrate 10 may include a lower surface facing away from the upper surface. A plurality of first connection pads 11 corresponding to the first TSVs TSV1 and a plurality of second connection pads 12 corresponding to the second TSVs TSV2 may be formed on the upper surface of the substrate 10. The first connection pads 11 and the first TSVs TSV1 corresponding to the first connection pads 11 may be electrically coupled with each other by the medium of first bumps B1. The second connection pads 12 and the second TSVs TSV2 corresponding to the second connection pads 12 may be electrically coupled with each other by the medium of second bumps B2.

A plurality of electrode pads 13 may be formed on the lower surface of the substrate 10. The electrode pads 13 may be electrically coupled with the first and second connection pads 11 and 12 formed on the upper surface of the substrate 10, through circuit patterns (not illustrated). The circuit patterns are formed in the substrate 10. External connection electrodes 20 such as, for example but not limited to, solder balls may be formed on the electrode pads 13.

The semiconductor memory device 100 may be electrically coupled with an external memory controller (not illustrated) through the external connection electrodes 20. The external connection electrodes 20 may serve as transfer paths of signals or power is between the semiconductor memory device 100 and the memory controller. The signals may include data signals DATA and control signals, and the power may include the power supply voltage VDD and the ground voltage VSS. The control signals may include commands signal CMD, addresses ADDR, a clock signal CLK, and chip select signals CS.

The memory controller may be electrically coupled with the semiconductor memory device 100 and a host (not shown), and may access the semiconductor memory device 100 in response to a request from the host.

The first memory chips M11 to M14 and the second memory chips M21 to M24 may share the external connection electrodes 20. For example, the first memory chips M11 to M14 and the second memory chips M21 to M24 may share the external connection electrodes 20 for transferring the data signals DATA and the control signals CMD, ADDR, CLK and CS. At least one first connection pad 11 and at least one second connection pad 12 may simultaneously correspond to one electrode pad 13, and the circuit patterns of the substrate 10 may electrically couple the electrode pad 13 and the first to and second connection pads 11 and 12 corresponding to the electrode pad 13.

In order to protect the first memory chips M11 to M14 and the second memory chips M21 to M24 from external circumstances, a molding part 30 which molds the first and second memory chips M11 to M14 and M21 to M24 may be formed on the upper surface of the substrate 10. The molding part 30 may include an epoxy molding compound (EMC).

Figure 2:
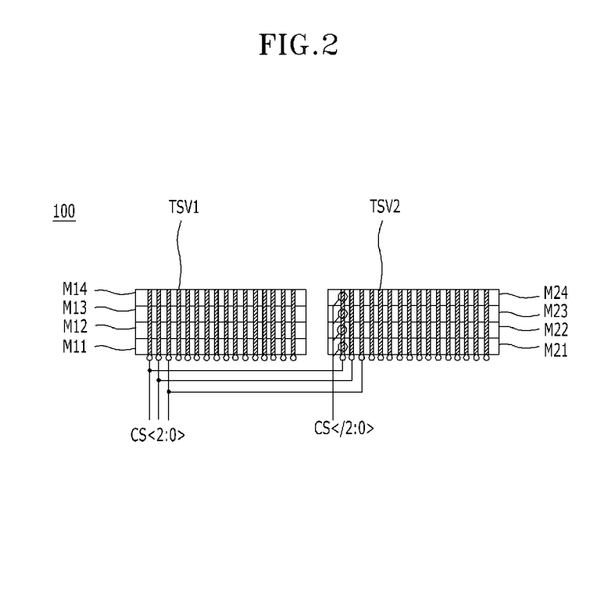
FIG. 2 is a view schematically illustrating a representation of a semiconductor memory device in accordance with an embodiment.

FIG. 2 is a view schematically illustrating a representation of a semiconductor memory device in accordance with an embodiment.

Referring to FIG. 2, chip select signals CS<2:0> provided from an external memory controller may be inputted to the first and second memory chips M11 to M14 and M21 to M24.

The chip select signals CS<2:0> may be signals for distinguishing a chip from included in the first and second memory chips M11 to M14 and M21 to M24 from other chips included in the first and second memory chips M11 to M14 and M21 to M24. In the examples where the number of the first and second memory chips M11 to M14 and M21 to M24 provided in the semiconductor memory device 100 is 8, the 8 first and second memory chips M11 to M14 and M21 to M24 may be distinguished from one another by using the chip select signals CS<2:0> of 3 bits.

For example, the chip select signals CS<2:0> for the first memory chip M11 forming the lowermost layer may have the value of '000'. For example, the chip select signals CS<2:0> for the first memory chip M12 forming a second layer when viewed from the bottom (i.e., when counting from the bottom) may have the value of '001'. For example, the chip select signals CS<2:0> for the first memory chip M13 forming a third layer when viewed from the bottom may have the value of '010'. For example, the chip select signals CS<2:0> for the first memory chip M14 forming a fourth layer when viewed from the bottom may have the value of '011'. For example, the chip select signals CS<2:0> for the second memory chip M21 forming the lowermost layer may have the value of '100'. For example, the chip select signals CS<2:0> for the second memory chip M22 forming a second layer when viewed from the bottom may have the value of '101'. For example, the chip select signals CS<2:0> for the second memory chip M23 forming a third layer when viewed from the bottom may have the value of '110'. For example, the chip select signals CS<2:0> for the second memory chip M24 forming a fourth layer when viewed from the bottom may have the value of '111'.

Slice identification information Slice<2:0> may be set to the respective first and second memory chips M11 to M14 and M21 to M24. In the examples where the number of the first and second memory chips M11 to M14 and M21 to M24 provided in the semiconductor memory device 100 is 8, the slice identification information Slice<2:0> of 3 bits may be used.

The slice identification information Slice<2:0> of each of the to first memory chips M11 to M14 may represent information on which layer a corresponding first memory chip is positioned among the first memory chips M11 to M14 when viewed from the bottom. Similarly, the slice identification information Slice<2:0> of each of the second memory chips M21 to M24 may represent information on which layer a corresponding second memory chip is positioned among the second memory chips M21 to M24 when viewed from the bottom. The same slice identification information Slice<2:0> may be set to a first memory chip and a second memory chip which are positioned on the same layer.

Each of the first memory chips M11 to M14 may be configured to activate a chip enable signal CE when the chip select signals CS<2:0> and its slice identification information Slice<2:0> correspond to each other, and may be accessed in response to the activated chip enable signal CE. Each of the second memory chips M21 to M24 may be configured to activate a chip enable signal CE when most significant bit-inverted chip select signals CS</2:0> which are generated by inverting the most significant bit (MSB) of the chip select signals CS<2:0> and its slice identification information Slice<2:0> correspond to each other, and may be accessed in response to the activated chip enable signal CE.

Hereafter, the semiconductor memory devices in accordance with the embodiments will be described with reference to FIGS. 3A and 3B.

Figure 3A:
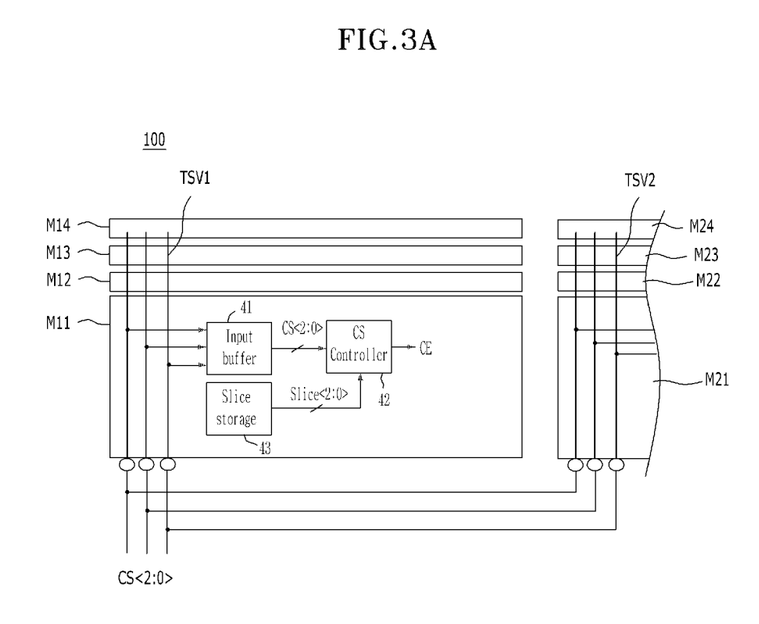
FIGS. 3A and 3B are block diagrams representations of the semiconductor memory devices illustrated in FIG. 2.
Figure 3B:
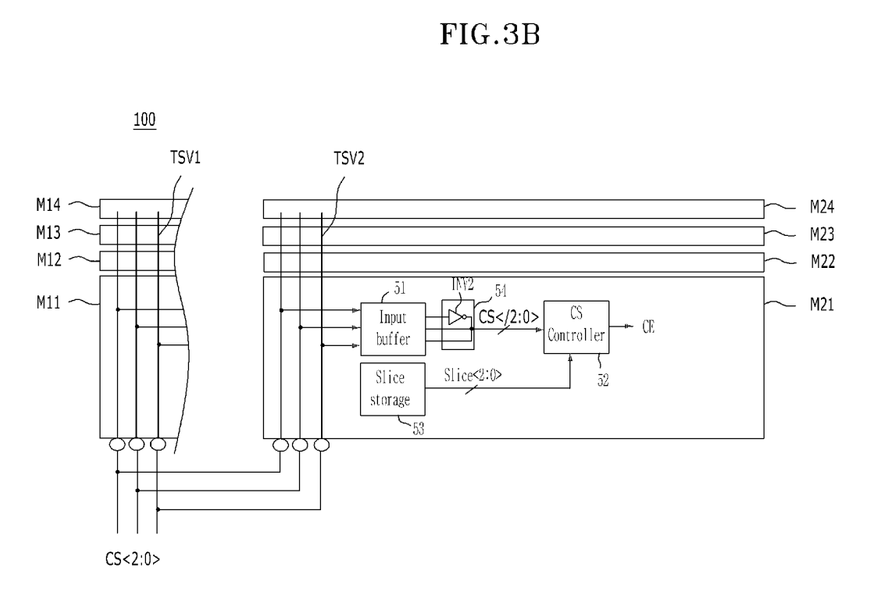

In FIGS. 3A and 3B, for the sake of convenience in explanation, only the block configurations of the lowermost first and second memory chips M11 and M21 among the first and second memory chips M11 to M14 and M21 to M24 are illustrated. The remaining first and second memory chips M12 to M14 and M22 to M24 may have the same block configurations as the lowermost first and second memory chips M11 and M21.

Referring to FIG. 3A, each of the first memory chips M11 to M14 may include an input buffer 41, a chip selection controller (CS controller) 42, a slice identification information storage (slice storage) 43, a control logic (not shown), and a memory cell array (not shown).

The memory cell array may be included in the core circuit region, and the input buffer 41, the chip selection controller 42, the slice identification information storage 43 and the control logic may be included in the peripheral circuit region.

The input buffer 41 may receive the chip select signals CS<2:0>. The chip select signals CS<2:0> may be transmitted through the first TSVs TSV1. The chip select signals CS<2:0> received through the input buffer 41 may be provided to the chip selection controller 42.

The chip selection controller 42 may output the chip enable signal CE. The chip enable signal CE may be activated and have a logic high value, when the chip select signals CS<2:0> received through the input buffer 41 and its slice identification information Slice<2:0> correspond to each other. The chip selection controller 42 may output the chip enable signal CE. The chip enable signal CE may be deactivated and have a logic low value, when the chip select signals CS<2:0> received through the input buffer 41 and its slice identification information Slice<2:0> do not correspond to each other.

Figure 4:
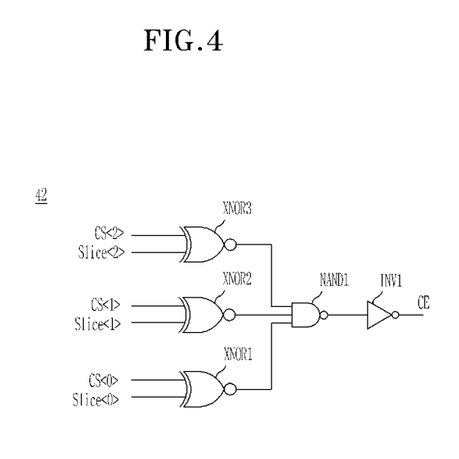
FIG. 4 is a circuit diagram of a representation of the chip selection controller illustrated in FIG. 3A.

A representation of an embodiment of the chip selection controller 42 is illustrated in FIG. 4.

Referring to FIG. 4, the chip selection controller 42 may include a plurality of XNOR gates XNOR1 to XNOR3, a NAND gate NAND1, and an inverter INV1.

The XNOR gates XNOR1 to XNOR3 may compare, by bit, the chip select signals CS<2:0> received through the input buffer 41 (See FIG. 3A) and the slice identification information Slice<2:0> thereof, and output logic high values when the chip select signals CS<2:0> and the slice identification information Slice<2:0> correspond to each other. According to the XNOR logic calculations of the XNOR gates XNOR1 to XNOR3, it is determined whether or not the chip select signals CS<2:0> of a memory chip in which an operation is to be actually performed and the slice identification information Slice<2:0> of the corresponding memory chip correspond to each other. The results of the XNOR logic calculations of the XNOR gates XNOR1 to XNOR3 may be inputted to the NAND gate NAND1.

The NAND gate NAND1 receives the results of the XNOR logic calculations of the XNOR gates XNOR1 to XNOR3, and may output a logic low signal when all the results of the XNOR logic calculations of the XNOR gates XNOR1 to XNOR3 have the logic high values. The NAND calculation result of the NAND gate NAND1 may be inputted to the inverter INV1. The inverter INV1 may invert the NAND logic calculation result of the NAND gate NAND1, and output the chip enable signal CE. According to such calculations of the NAND gate NAND1 and the inverter INV1, the chip enable signal CE which is activated and has the logic high value may be outputted in the cases where the chip select signals CS<2:0> of a memory chip in which an operation is to be actually performed and the slice identification information Slice<2:0> of the corresponding memory chip correspond to each other, and the chip enable signal CE which is deactivated and has the logic low value may be outputted in the cases where the chip select signals CS<2:0> of a memory chip in which an operation is to be actually performed and the slice identification information Slice<2:0> of the corresponding memory chip do not correspond to each other.

Referring again to FIG. 3A, the slice identification information storage 43 as a component for storing the slice identification information Slice<2:0> may be configured by a fuse box including a plurality of fuses or a register.

The memory cell array may include a plurality of unit memory cells. In the examples where the first memory chips M11 to M14 are DRAMs, each unit memory cell may be configured by, for example, one transistor and one capacitor.

While not illustrated, the memory cell array may be electrically coupled to an address decoder (not illustrated) through word lines (not illustrated), and may be electrically coupled to a data input/output unit (not illustrated) through bit lines (not illustrated). The address decoder may be electrically coupled to the memory cell array through the word lines. The address decoder may operate in response to the control of the control logic. The addresses ADDR inputted from the external memory controller may be transferred to the address decoder. The address decoder may decode row addresses from the transferred addresses ADDR. The address decoder may select a word line using the decoded row addresses. Further, the address decoder may decode column addresses from the transferred addresses ADDR. The address decoder may transfer the decoded column addresses to the data input/output unit.

The data input/output unit may be electrically coupled to the memory cell array through the bit lines. The data input/output unit may exchange the data signals DATA with the external memory controller. The data input/output unit may operate in response to the control of the control logic. The data input/output unit may receive the column addresses decoded by the address decoder, and may select a bit line using the decoded column addresses.

The control logic may receive the chip enable signal CE from the chip selection controller 42. The control logic may be electrically to coupled to the address decoder and the data input/output unit, and may control the operations of the address decoder and the data input/output unit by being enabled in response to the chip enable signal CE which is activated, such that the first memory chip may be accessed.

Referring to FIG. 3B, each of the second memory chips M21 to M24 may include an input buffer 51, a chip selection controller (CS controller) 52, a slice identification information storage (slice storage) 53, a memory cell array (not illustrated), a control logic (not illustrated), and an inversion circuit unit 54.

The input buffer 51, the chip selection controller 52 and the slice identification information storage 53 of each of the second memory chips M21 to M24 may have substantially the same configurations as the input buffer 41, the chip selection controller 42 and the slice identification information storage 43, respectively, of each of the first memory chips M11 to M14 described above with reference to FIG. 3A. Therefore, repeated descriptions for the same components will be omitted.

The memory cell array may include a plurality of unit memory cells. In the examples where the second memory chips M21 to M24 are flash memories, each memory cell may be, for example, a memory cell transistor having a double gate structure of a floating gate and a control gate.

The inversion circuit unit 54 may include an inverter INV2. The inverter INV2 may invert the logic of the most significant bit of the chip select signals CS<2:0> received through the input buffer 51. The inversion circuit unit 54 may receive the chip select signals CS</2:0> of which the most significant bit is inverted through the inverter INV2, and provide the most significant bit-inverted chip select signals CS</2:0> to the chip selection controller 52.

The chip selection controller 52 may output the chip enable signal CE. The chip enable signal CE may be activated and have a logic high value, when the most significant bit-inverted chip select signals CS</2:0> and its slice identification information Slice<2:0> correspond to each other. The chip selection controller 52 may output the chip enable signal CE. The chip enable signal CE may be deactivated and have a logic low value, when the most significant bit-inverted chip select signals CS</2:0> and its slice identification information Slice<2:0> do not correspond to each other.

The chip selection controller 52 of each of the second memory chips M21 to M24 may have substantially the same configuration as the chip selection controller 42 of each of the first memory chips M11 to M14 described above with reference to FIG. 4. However, unlike the chip selection controller 42 of each of the first memory chips M11 to M14 which receives the chip select signals CS<2:0>, the chip selection controller 52 of each of the second memory chips M21 to M24 is different in that it receives the most significant bit-inverted chip select signals CS</2:0>.

Herein below, operations of the semiconductor memory device in accordance with the embodiments, described above with reference to FIGS. 2 to 3B, will be described.

First, the slice identification information Slice<2:0> is set to each of the first and second memory chips M11 to M14 and M21 to M24.

The slice identification information Slice<2:0> set to each of the first memory chips M11 to M14 represents information on which layer a corresponding first memory chip is positioned among the first memory chips M11 to M14 when viewed from the bottom, and the slice identification information Slice<2:0> set to each of the second memory chips M21 to M24 may represent information on which layer a corresponding second memory chip is positioned among the second memory chips M21 to M24 when viewed from the bottom. The same slice identification information Slice<2:0> may be set to a first memory chip and a second memory chip positioned on the same layer. For example, the slice identification information Slice<2:0> of the first memory chip M11 and the second memory chip M21 of the lowermost layer may have the value of '000'. The slice identification information Slice<2:0> of the first memory chip M12 and the second memory chip M22 of the second layer when viewed from the bottom may have the value of '001'. The slice identification information Slice<2:0> of the first memory chip M13 and the second memory chip M23 of the third layer when viewed from the bottom may have the value of '010'. The slice identification information Slice<2:0> of the first memory chip M14 and the second memory chip M24 of the fourth layer when viewed from the bottom may have the value of '011'.

Each of the first memory chips M11 to M14 may be accessed when the chip select signals CS<2:0> inputted from an exterior and its slice identification information Slice<2:0> correspond to each other. Each of the second memory chips M21 to M24 may be accessed when the most significant bit-inverted chip select signals CS</2:0> and its slice identification information Slice<2:0> correspond to each other.

For example, it may be assumed that the chip select signals CS<2:0> with the value of '011' are inputted from the exterior. The slice identification information Slice<2:0> of the first memory chip M14 and the second memory chip M24 positioned on the fourth layer when viewed from the bottom, among the first and second memory chips M11 to M14 and M21 to M24, have the same value as '011'. However, because the first memory chip M14 is accessed when the chip select signals CS<2:0> inputted from the exterior and its slice identification information Slice<2:0> correspond to each other and the second memory chip M24 is accessed when the most significant bit-inverted chip select signals CS</2:0> and its slice identification information Slice<2:0> correspond to each other, the first memory chip M14 is accessed and the second memory chip M24 is not accessed.

It may be assumed that the chip select signals CS<2:0> with the value of '111' are inputted from the exterior. The slice identification information Slice<2:0> of the first memory chip M14 and the second memory chip M24 positioned on the fourth layer when viewed from the bottom, among the first and second memory chips M11 to M14 and M21 to M24, have the same value as '011'. However, because the first memory chip M14 is accessed when the chip select signals CS<2:0> inputted from the exterior and its slice identification information Slice<2:0> correspond to each other and the second memory chip M24 is accessed when the most significant bit-inverted chip select signals CS</2:0>and its slice identification information Slice<2:0> correspond to each other, the first memory chip M14 is not accessed and the second memory chip M24 is accessed. In short, the first memory chips M11 to M14 and the second memory chips M21 to M24 may not be simultaneously accessed, and may be operated with different timings.

Figure 5A:
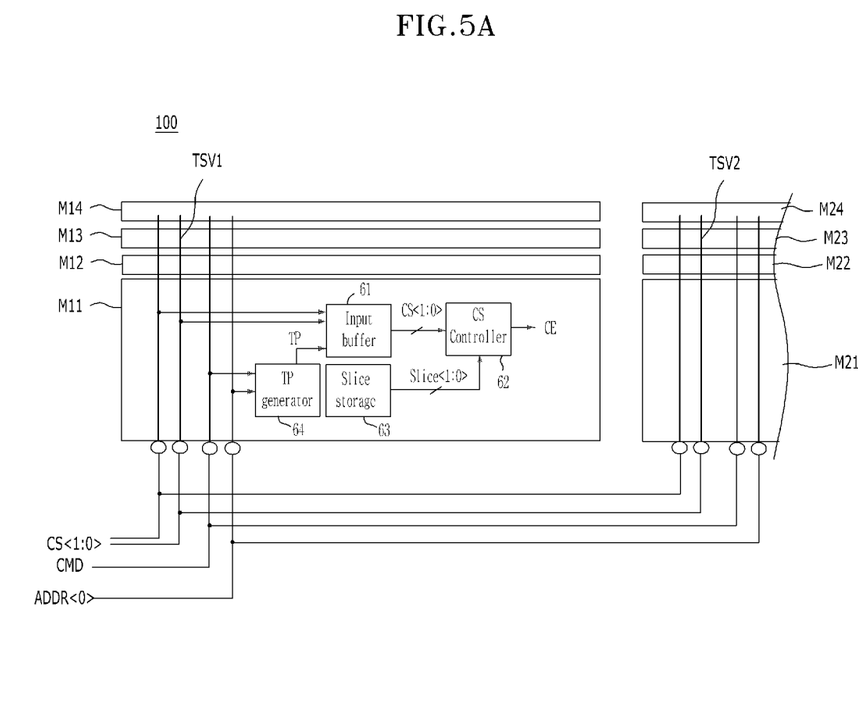
FIGS. 5A and 5B are block diagrams representations of a semiconductor memory device in accordance with an embodiment.
Figure 5B:
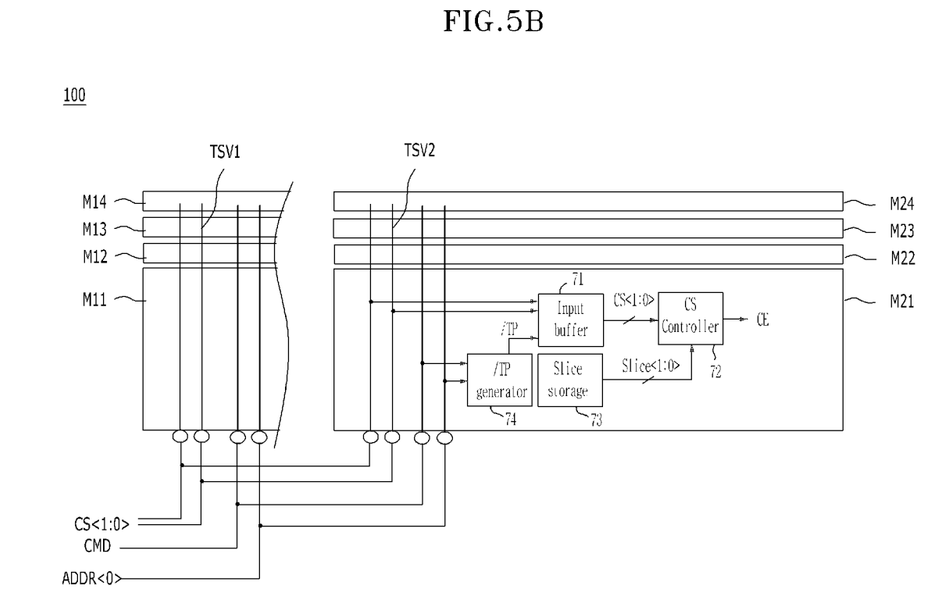
Figure 6:
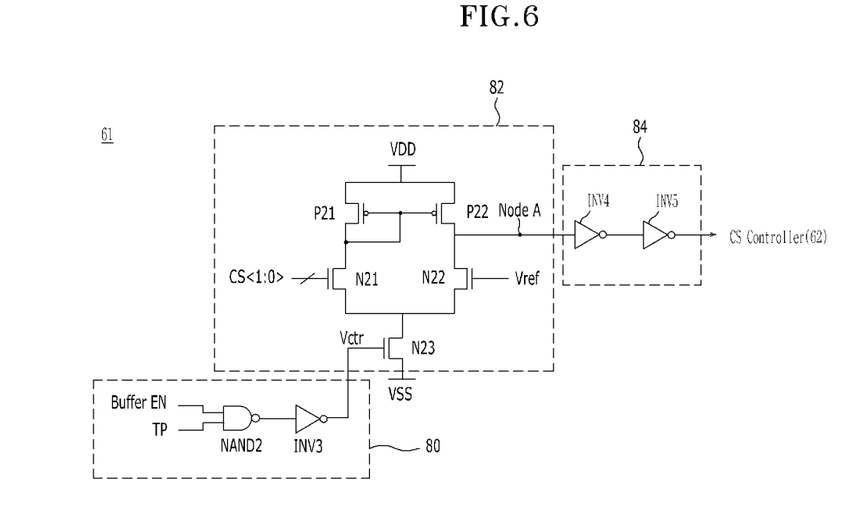
FIG. 6 is a circuit diagram of a representation of the input buffer illustrated in FIG. 5A.
Figure 7:
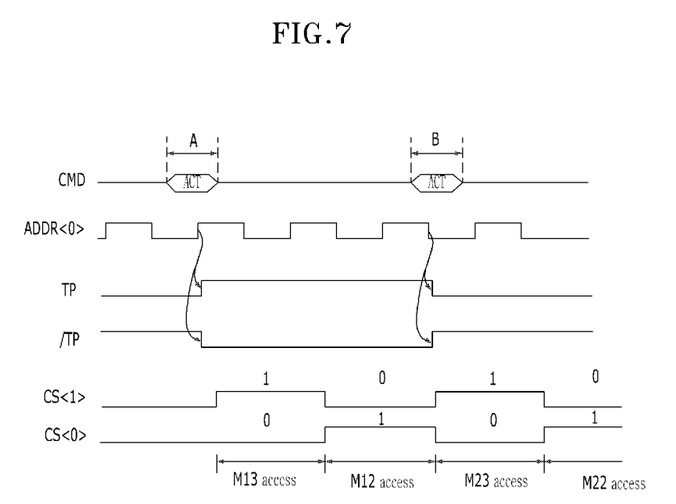
FIG. 7 is an operation timing diagram of the semiconductor memory device illustrated in FIGS. 5A and 5B.

FIGS. 5A and 5B are block diagram representations to assist in the explanation of a semiconductor memory device in accordance with an embodiment. FIG. 6 is a circuit diagram representation of the input buffer illustrated in FIG. 5A, and FIG. 7 is an operation timing diagram of the semiconductor memory devices illustrated in FIGS. 5A and 5B.

In FIGS. 5A and 5B, for the sake of convenience in explanation, only the block configurations of the lowermost first and to second memory chips M11 and M21 among the first and second memory chips M11 to M14 and M21 to M24 are illustrated, and the remaining first and second memory chips M12 to M14 and M22 to M24 may have substantially the same block configurations as the lowermost first and second memory chips M11 and M21.

Referring to FIGS. 5A and 5B, each of the first memory chips M11 to M14 may generate a trigger pulse signal TP. The trigger pulse signal TP may be generated in response to a command signal CMD and an address signal ADDR<0> received by the first memory chips M11 to M14 from an exterior. The first memory chips M11 to M14 may receive chip select signals CS<1:0> inputted from the exterior, in response to the trigger pulse signal TP. The command signal CMD, the address signal ADDR<0> and the chip select signals CS<1:0> may be inputted from the memory controller.

Each of the second memory chips M21 to M24 may generate an inverted trigger pulse signal /TP (see FIG. 5B). the inverted trigger pulse signal /TP may be generated in response to the command signal CMD and the address signal ADDR<0> inputted from the exterior. The second memory chips M21 to M24 may receive the chip select signals CS<1:0> from the exterior in response to the inverted trigger pulse signal /TP. Accordingly, the chip select signals CS<1:0>, inputted from the exterior, may be received selectively by any one part of the first memory chips M11 to M14 and the second memory chips M21 to M24.

The address signal ADDR<0> may be set, for example, as a least significant bit (LSB) of the addresses ADDR for addressing memory cells.

The chip select signals CS<1:0> are signals for distinguishing the first memory chips M11 to M14 or distinguishing the second memory chips M21 to M24. In the examples where each of the number of the first memory chips M11 to M14 and the number of the second memory chips M21 to M24 provided in the semiconductor memory device 100 is, for example, 4, the first memory chips M11 to M14 may be distinguished from one another and the second memory chips M21 to M24 may be distinguished from one another, by using the chip select signals CS<1:0> of 2 bits.

For example, the chip select signals CS<1:0> for the first memory chip M11 and the second memory chip M21 forming the lowermost layer may have the value of '00'. For example, the chip select signals CS<1:0> for the first memory chip M12 and the second memory chip M22 forming a second layer when viewed from the bottom may have the value of '01'. For example, the chip select signals CS<1:0> for the first memory chip M13 and the second memory chip M23 forming a third layer when viewed from the bottom may have the value of '10'. For example, the chip select signals CS<1:0> for the first memory chip M14 and the second memory chip M24 forming a fourth layer when viewed from the bottom may have the value of '11'.

Each of the first memory chips M11 to M14 may be configured to activate a chip enable signal CE when the received chip select signals CS<1:0> and its slice identification information Slice<1:0> correspond to each other, and be accessed in response to the activated chip enable signal CE. Similarly, each of the second memory chips M21 to M24 may be configured to activate a chip enable signal CE when the received chip select signals CS<1:0> and its slice identification information Slice<1:0> correspond to each other, and be accessed in response to the activated chip enable signal CE.

Referring to FIG. 5A, each of the first memory chips M11 to M14 may include an input buffer 61, a chip selection controller (CS controller) 62, a slice identification information storage (slice storage) 63, a memory cell array (not illustrated), a control logic (not illustrated), and a trigger pulse generator (TP generator) 64. The memory cell array may be included in the core circuit region. The input buffer 61, the chip selection controller 62, the slice identification information storage 63, the control logic and the trigger pulse generator 64 may be included in the peripheral circuit region.

The trigger pulse generator 64 may generate the trigger pulse signal TP for defining the enable start timing of the input buffer 61 in response to the rising edge of the address signal ADDR<0> with the command signal CMD activated and for defining the disable start timing of the input buffer 61 in response to the falling edge of the address signal ADDR<0> with the command signal CMD activated. The trigger pulse signal TP generated by the trigger pulse generator 64 may be provided to the input buffer 61.

The input buffer 61 may be enabled and receive the chip select signals CS<1:0> transmitted through the first TSVs TSV1, in the cases where the trigger pulse signal TP provided from the trigger pulse generator 64 is activated to a logic high level. The input buffer 61 is disabled and does not receive the chip select signals CS<1:0>, in the cases where the trigger pulse signal TP is deactivated to a logic low level.

A representation of an embodiment of the input buffer 61 is illustrated in FIG. 6.

Referring to FIG. 6, the input buffer 61 may include a control signal generator 80, a differential amplifier 82, and a delay circuit unit 84.

The control signal generator 80 may include a NAND gate NAND2 and an inverter INV3. The NAND gate NAND2 may perform a NAND logic calculation for the trigger pulse signal TP provided from the trigger pulse generator 64 (see FIG. 5A) and a buffer enable signal Buffer EN. The result of the NAND logic calculation of the NAND gate NAND2 may be provided to the inverter INV3. The inverter INV3 may invert the NAND logic calculation result of the NAND gate NAND2, and generate a control signal Vctr. According to such logic calculations of the NAND gate NAND2 and the inverter INV3, the trigger pulse signal TP may be outputted as the control signal Vctr in the cases where the buffer enable signal Buffer EN has a logic high value.

The differential amplifier 82 may be configured by 3 NMOS transistors N21, N22 and N23 and 2 PMOS transistors P21 and P22. The delay circuit unit 84 may include inverters INV4 and INV5. The operation of the differential amplifier 82 is determined according to the control signal Vctr. The differential amplifier 82 may transfer the chip select signals CS<1:0> to an output node Node A in the case where the control signal Vctr has a logic high value. In the case where the control signal Vctr has a logic low value, the NMOS transistor N23 of the differential amplifier 82 is turned off and the differential amplifier 82 is disabled, and accordingly, the input buffer 61 does not transfer the chip select signals CS<1:0> to the output node Node A.

The delay circuit unit 84 may delay the chip select signals CS<1:0> outputted from the differential amplifier 82, by a predetermined time, and output the delayed chip select signals CS<1:0>. The signals outputted from the delay circuit unit 84 may be provided to the chip selection controller 62 (see FIG. 5A).

Referring again to FIG. 5A, the chip selection controller 62 may compare the chip select signals CS<1:0> provided from the input buffer 61 and its slice identification information Slice<1:0>. The chip selection controller 62 may output the chip enable signal CE which is activated and has a logic high value, when the chip select signals CS<1:0> and its slice identification information Slice<1:0> correspond to each other, and may output the chip enable signal CE which is deactivated and has a logic low value, when the chip select signals CS<1:0> and its slice identification information Slice<1:0> do is not correspond to each other.

The slice identification information storage 63 as a component for storing the slice identification information Slice<1:0> may be configured by a fuse box including a plurality of fuses or a register.

The memory cell array may include a plurality of unit memory cells. In the examples where the first memory chips M11 to M14 are DRAMs, each unit memory cell may be configured by one transistor and one capacitor.

While not illustrated, the memory cell array may be electrically coupled to an address decoder (not illustrated) through word lines (not illustrated), and may be electrically coupled to a data input/output unit (not illustrated) through bit lines (not illustrated). The address decoder may be electrically coupled to the memory cell array through the word lines. The address decoder may operate in response to the control of the control logic. The addresses ADDR inputted from the external memory controller may be transferred to the address decoder. The address decoder may decode row addresses from the transferred addresses ADDR, and may select a to word line using the decoded row addresses. Further, the address decoder may decode column addresses from the transferred addresses ADDR, and may transfer the decoded column addresses to the data input/output unit.

The data input/output unit may be electrically coupled to the memory cell array through the bit lines. The data input/output unit may exchange the data signals DATA with the external memory controller. The data input/output unit may operate in response to the control of the control logic. The data input/output unit may receive the column addresses decoded by the address decoder, and may select a bit line using the decoded column addresses.

The control logic may receive the chip enable signal CE from the chip selection controller 62. The control logic may be electrically coupled to the address decoder and the data input/output unit, and may control the operations of the address decoder and the data input/output unit by being enabled in response to the chip enable signal CE which is activated, such that the first memory chip may be accessed.

Referring again to FIG. 5B, each of the second memory chips M21 to M24 may include an input buffer 71, a chip selection controller (CS controller) 72, a slice identification information storage (slice storage) 73, a memory cell array (not illustrated), a control logic (not illustrated), and an inverted trigger pulse generator (/TP generator) 74.

The memory cell array may include a plurality of unit memory cells. In the examples where the second memory chips M21 to M24 are flash memories, each memory cell may be a memory cell transistor having a double gate structure of a floating gate and a control gate.

The input buffer 71, the chip selection controller 72 and the slice identification information storage 73 of each of the second memory chips M21 to M24 may have substantially the same configurations as the input buffer 61, the chip selection controller 62 and the slice identification information storage 63, respectively, of each of the first memory chips M11 to M14 described above with reference to FIG. 5A. Therefore, repeated descriptions for the same components will be omitted.

The inverted trigger pulse generator 74 may generate the inverted trigger pulse signal /TP for defining the disable start timing of the input buffer 71 in response to the rising edge of the address signal ADDR<0> with the command signal CMD activated and for defining the enable start timing of the input buffer 71 in response to the falling edge of the address signal ADDR<0> with the command signal CMD activated.

The input buffer 71 may be enabled and transfer the chip select signals CS<1:0> transmitted through the second TSVs TSV2, to the chip selection controller 72, in the cases where the inverted trigger pulse signal /TP provided from the inverted trigger pulse generator 74 is activated to a logic high level. The input buffer 71 is disabled and does not transfer the chip select signals CS<1:0> to the chip selection controller 72, in the cases where the inverted trigger pulse signal /TP is deactivated to a logic low level.

The input buffer 71 of each of the second memory chips M21 to M24 may have substantially the same configuration as the input buffer 61 of each of the first memory chips M11 to M14 described above with reference to FIG. 6. However, unlike the input buffer 61 of each of the first memory chips M11 to M14 which operate in response to the trigger pulse signal TP, the input buffer 71 of each of the second memory chips M21 to M24 is different in that they operate in response to the inverted trigger pulse signal /TP.

Hereinbelow, operations of the semiconductor memory devices in accordance with the embodiments, described above with reference to FIGS. 5A and 5B, will be described with reference to FIG. 7.

First, the slice identification information Slice<1:0> is set to each of the first and second memory chips M11 to M14 and M21 to M24.

The slice identification information Slice<1:0> set to each of the first memory chips M11 to M14 represents information on which layer a corresponding first memory chip is positioned among the first memory chips M11 to M14 when viewed from the bottom, and the slice identification information Slice<1:0> set to each of the second to memory chips M21 to M24 may represent information on which layer a corresponding second memory chip is positioned among the second memory chips M21 to M24 when viewed from the bottom. The same slice identification information Slice<1:0> may be set to a first memory chip and a second memory chip positioned on the same layer. For example, the slice identification information Slice<1:0> of the first memory chip M11 and the second memory chip M21 of the lowermost layer may have the value of '00'. For example, the slice identification information Slice<1:0> of the first memory chip M12 and the second memory chip M22 of the second layer when viewed from the bottom may have the value of '01'. For example, the slice identification information Slice<1:0> of the first memory chip M13 and the second memory chip M23 of the third layer when viewed from the bottom may have the value of '10'. For example, the slice identification information Slice<1:0> of the first memory chip M14 and the second memory chip M24 of the fourth layer when viewed from the bottom may have the value of '11'.

In a period A in which the command signal CMD is activated, the trigger pulse generator 64 of each of the first memory chips M11 to M14 generates the trigger pulse signal TP for defining the enable start timing of the input buffer 61, in response to the rising edge of the address signal ADDR<0>. The inverted trigger pulse generator 74 of each of the second memory chips M21 to M24 generates the inverted trigger pulse signal /TP for defining the disable start timing of the input buffer 71, in response to the rising edge of the address signal ADDR<0>. The input buffers 61 of the first memory chips M11 to M14 are enabled in response to the trigger pulse signal TP. The input buffers 71 of the second memory chips M21 to M24 are disabled in response to the inverted trigger pulse signal /TP. Accordingly, the is chip select signals CS<1:0> are received by the first memory chips M11 to M14 by passing through the input buffers 61 in enabled states, and any one of the first memory chips M11 to M14 is accessed in response to the received chip select signals CS<1:0>. For example, the first memory chip M13 forming the third layer when viewed from the bottom is accessed in the cases where the chip select signals CS<1:0> have the value of '10', and the first memory chip M12 forming the second layer when viewed from the bottom is accessed in the cases where the chip select signals CS<1:0> have the value of '01'. Meanwhile, since the input buffers 71 of the second memory chips M21 to M24 are in disabled states, the chip select signals CS<1:0> are not received by the second memory chips M21 to M24.

In a period B the command signal CMD is activated, the trigger pulse generator 64 of each of the first memory chips M11 to M14 generates the trigger pulse signal TP for defining the disable start timing of the input buffer 61, in response to the falling edge of the address signal ADDR<0>. The inverted trigger pulse generator 74 of each of the second memory chips M21 to M24 generates the inverted trigger pulse signal /TP for defining the enable start timing of the input buffer 71, in response to the falling edge of the address signal ADDR<0>. The input buffers 61 of the first memory chips M11 to M14 are disabled in response to the trigger pulse signal TP. The input buffers 71 of the second memory chips M21 to M24 are enabled in response to the inverted trigger pulse signal /TP. The chip select signals CS<1:0> are received by the second memory chips M21 to M24 by passing through the input buffers 71 in enabled states, and any one of the second memory chips M21 to M24 is accessed in response to the received chip select signals CS<1:0>. For example, the second memory chip M23 forming the third layer when viewed from the bottom is accessed in the cases where the chip select signals CS<1:0> have the value of '10', and the second memory chip M22 forming the second layer when viewed from the bottom is accessed in the cases where the chip select signals CS<1:0> have the value of '01'. Meanwhile, since the input buffers 61 of the first memory chips M11 to M14 are in disabled states, the chip select signals CS<1:0> are not received by the first memory chips M11 to M14. In short, the first memory chips M11 to M14 and the second memory chips M21 to M24 may not be simultaneously accessed, and may be operated with different timings.

According to the various embodiments, since different kinds of memories are integrated in a single package, the kind of a memory (a volatile memory or a nonvolatile memory) in which data are to be stored may be selected according to a data characteristic. Therefore, it may be easy to store and manage data, and a high memory utilization degree may be provided. Further, since different kinds of memories are operated with different timings, external connection electrodes may be shared. As a consequence, the number of external connection electrodes may be decreased, the number of signals is between a semiconductor memory device and a memory controller and the number of signals between the memory controller and a host may be decreased, and the size of the memory controller and the current consumption of the memory controller may be reduced. Moreover, because the host may access different kinds of memories through the same signal lines, commands may be efficiently allocated. In addition, because the length of TSVs may be decreased when compared to the examples where memory chips are stacked all at once in line, the latencies of TSVs may be shortened.

The above-described semiconductor memory device may be applied to various semiconductor devices and package modules.

Figure 8:
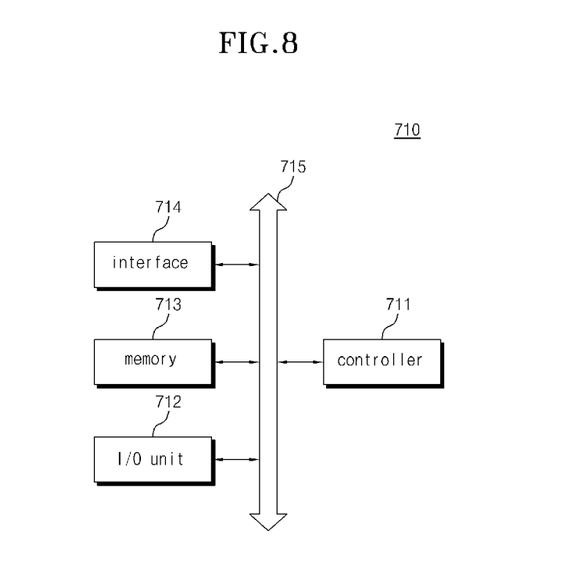
FIG. 8 is a block diagram illustrating an example of a representation of an electronic system including the semiconductor memory devices in accordance with the embodiments.

Referring to FIG. 8, the semiconductor memory device in accordance with the embodiments may be applied to an electronic system 710. The electronic system 710 may include a controller 711, an input/output unit 712, and a memory 713. The controller 711, the input/output unit 712 and the memory 713 may be electrically coupled with one another through a bus 715 which provides a data movement path.

For example, the controller 711 may include at least one microprocessor, at least one digital signal processor, at least one microcontroller, and at least one of logic circuits capable of performing the same functions as these components. The memory 713 may include at least one semiconductor memory device in accordance with the various embodiments. The input/output unit 712 is may include at least one selected among a keypad, a keyboard, a display device, a touch screen, and so forth. The memory 713 as a device for storing data may store data or/and commands to be executed by the controller 711 or the like.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

In the examples where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 9:
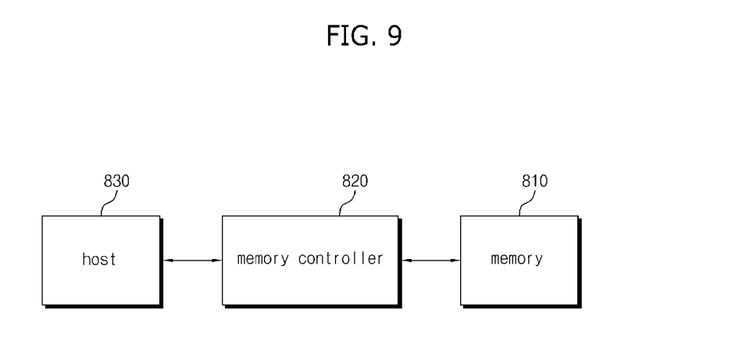
FIG. 9 is a block diagram illustrating an example of a representation of a memory card including the semiconductor memory devices in accordance with the embodiments.

Referring to FIG. 9, the semiconductor memory device in accordance with the various embodiments may be applied to a memory card. For example, the memory card may include a memory 810 and a memory controller 820. The memory 810 and the memory controller 820 may store data or read stored data.

The memory 810 may include at least one semiconductor memory device in accordance with the various embodiments, and the memory controller 820 may control the memory 810 to read stored data or store data, in response to a read/write request from a host 830.

While various embodiments have been described above, it will be understood to those skilled in the art that the embodiments described are by way of example only. Accordingly, the semiconductor memory devices described herein should not be limited based on the described embodiments.

What is claimed is:

1. A semiconductor memory device comprising:
a plurality of memory chips stacked upon one another, and electrically coupled to one another through a plurality of first TSVs;
a plurality of second memory chips stacked separately from the first memory chips, and the plurality of second memory chips electrically coupled to one another through a plurality of second TSVs; and
a plurality of external connection electrodes coupled to both the first memory chips and the second memory chips,
wherein one of the first memory chips and the second memory chips is accessed in response to chip select signals inputted through the external connection electrodes,
wherein each of the first memory chips comprises:
a chip selection controller configured to output a chip enable signal, activated, when the chip select signals and a slice identification information set to each first memory chip correspond to each other; and
a control logic configured to control the corresponding first memory chip to be accessed in response to the activated chip enable signal, wherein each of the second memory chips comprises:
an inversion circuit unit configured to generate a most significant bit-inverted chip select signals by inverting a most significant bit of the chip select signals;
a chip selection controller configured to output a chip enable signal, activated, when the most significant bit-inverted chip select signals and the slice identification information set to each second memory chip correspond to each other; and
a control logic configured to control the corresponding second memory chip to be accessed in response to the activated chip enable signal.

2. The semiconductor memory device according to claim 1, wherein the first memory chips include a memory type different from a memory type included in the second memory chips.

3. The semiconductor memory device according to claim 2, wherein the first memory chips include volatile memories, and the second memory chips include nonvolatile memories.

4. The semiconductor memory device according to claim 1, wherein the first memory chips and the second memory chips receive control signals through the external connection electrodes shared by both the first memory chips and the second memory chips.

5. The semiconductor memory device according to claim 1, wherein the chip select signals are signals distinguishing a chip included in the first memory chips and the second memory chips from other chips included in the first memory chips and the second memory chips.

6. The semiconductor memory device according to claim 1, wherein the slice identification information set to each of the first memory chips represents information on which layer a corresponding first memory chip is positioned among the first memory chips, and the slice identification information set to each of the second memory chips represents information on which layer a corresponding second memory chip is positioned among the second memory chips.

7. The semiconductor memory device according to claim 1, wherein each of the first memory chips and the second memory chips further comprises:
   a slice identification information storage configured to store slice identification information of each memory chip.

8. The semiconductor memory device according to claim 7, wherein the slice identification information storage comprises a fuse box including a plurality of fuses.

9. The semiconductor memory device according to claim 7, wherein the slice identification information storage comprises a fuse box including a register.

10. A semiconductor memory device comprising:
    a plurality of memory chips stacked upon one another, and electrically coupled to one another through a plurality of first TSVs;
    a plurality of second memory chips stacked separately from the first memory chips, and the plurality of second memory chips electrically coupled to one another through a plurality of second TSVs; and
    a plurality of external connection electrodes coupled to both the first memory chips and the second memory chips,
    wherein one of the first memory chips and the second memory chips is accessed in response to chip select signals inputted through the external connection electrodes,
    wherein each of the first memory chips comprises:
      a trigger pulse generator configured to generate a trigger pulse signal in response to a command signal and an address signal;
      an input buffer configured to be enabled in response to the trigger pulse signal, and receive the chip select signals;
      a chip selection controller configured to output a chip enable signal, activated, when the chip select signals received through the input buffer and a slice identification information set to each first memory chip correspond to each other; and
      a control logic configured to control the corresponding first memory chip to be accessed in response to the activated chip enable signal,
    wherein each of the second memory chips comprises:
      an inverted trigger pulse generator configured to generate an inverted trigger pulse signal in response to the command signal and the address signal;
      an input buffer configured to be enabled in response to the inverted trigger pulse signal, and receive the chip select signals;
      a chip selection controller configured to output a chip enable signal, activated, when the chip select signals received through the input buffer and the slice identification information set to each second memory chip correspond to each other; and
      a control logic configured to control the corresponding second memory chip to be accessed in response to the activated chip enable signal.

11. The semiconductor memory device according to claim 10, wherein the chip select signals are signals for distinguishing the first memory chips from one another and for distinguishing the second memory chips from one another.

12. The semiconductor memory device according to claim 10, wherein the slice identification information set to each of the first memory chips represents information on which layer a corresponding first memory chip is positioned among the first memory chips, and the slice identification information set to each of the second memory chips represents information on which layer a corresponding second memory chip is positioned among the second memory chips.

13. The semiconductor memory device according to claim 10, wherein the trigger pulse signal defines an enable start timing of the input buffer in response to a rising edge of the address signal with the command signal activated and defines a disable start timing of the input buffer in response to a falling edge of the address signal with the command signal activated.

14. The semiconductor memory device according to claim 10, wherein the inverted trigger pulse signal defines a disable start timing of the input buffer in response to a rising edge of the address signal with the command signal activated and defines an enable start timing of the input buffer in response to a falling edge of the address signal with the command signal activated.

15. The semiconductor memory device according to claim 10, wherein the address signal is a least significant bit of addresses inputted through the external connection electrodes to address memory cells of the first memory chips and the second memory chips.

16. The semiconductor memory device according to claim 10, wherein the first memory chips include a memory type different from a memory type included in the second memory chips.

17. The semiconductor memory device according to claim 10, wherein the first memory chips and the second memory chips receive control signals through the external connection electrodes shared by both the first memory chips and the second memory chips.

18. The semiconductor memory device according to claim 10, wherein each of the first memory chips and the second memory chips further comprises:
    a slice identification information storage configured to store slice identification information of each memory chip.

19. The semiconductor memory device according to claim 18, wherein the slice identification information storage comprises a fuse box including a plurality of fuses.

20. The semiconductor memory device according to claim 18, wherein the slice identification information storage comprises a fuse box including a register.

* * * * *